United States Patent
Chen et al.

(10) Patent No.: US 11,013,151 B1
(45) Date of Patent: May 18, 2021

(54) ELECTRONIC COMPONENT HOUSING COOLING SYSTEM

(71) Applicant: Quanta Computer Inc., Taoyuan (TW)

(72) Inventors: Yi-Chieh Chen, Taoyuan (TW); Ming-Hung Tsai, Taoyuan (TW); Yan-Kuei Chen, Taoyuan (TW); Yi-He Huang, Taoyuan (TW)

(73) Assignee: QUANTA COMPUTER INC., Taoyuan City (TW)

( * ) Notice: Subject to any disclaimer, the term of this patent is extended or adjusted under 35 U.S.C. 154(b) by 0 days.

(21) Appl. No.: 16/732,107

(22) Filed: Dec. 31, 2019

(51) Int. Cl.
H05K 7/20 (2006.01)
(52) U.S. Cl.
CPC ................ H05K 7/20736 (2013.01)
(58) Field of Classification Search
CPC ........ H05K 7/20736; H05K 7/20145
See application file for complete search history.

(56) References Cited

U.S. PATENT DOCUMENTS

| | | | | |
|---|---|---|---|---|
| 7,813,120 | B2 * | 10/2010 | Vinson | H05K 7/20736 361/679.5 |
| 2013/0278121 | A1 * | 10/2013 | Shimada | F24F 13/14 312/236 |

* cited by examiner

Primary Examiner — Mukundbhai G Patel
(74) Attorney, Agent, or Firm — Nixon Peabody LLP (57) ABSTRACT

A chassis includes a receiver frame for receiving a plurality of electronic components. The receiver frame includes a front end, a rear end, a top wall, and a bottom wall. The receiver frame also includes one or more apertures positioned in the bottom wall or the top wall at a location adjacent to the front end. The receiver frame also includes a plurality of air flow channels coupling openings in the front end to the one or more apertures such that air flow from the openings of the front end is first directed towards the rear end across the plurality of electronic components before being directed back towards the front end and then exiting the one or more apertures.

20 Claims, 6 Drawing Sheets

ELECTRONIC COMPONENT HOUSING COOLING SYSTEM

FIELD OF THE INVENTION

The present disclosure relates generally to cooling systems for electronic devices, and more specifically, to an electronic component housing system incorporating a cooling system for improved fan performance.

BACKGROUND

Electronic devices, such as servers, include electronic components that are connected to a power supply unit. Servers generate an enormous amount of heat due to the operation of the internal electronic components. These internal electronic components typically include controllers, processors, LAN cards, hard disk drives, and solid state disk drives. Overheating from the inefficient removal of such heat has the potential to shut down or impede the operation of the electronic components. Thus, servers are designed to rely on air flow through the interior of the device to carry away heat generated from the electronic components.

Servers often include various heat sinks that are attached to the electronic components. Heat sinks are typically composed of thermally conductive material. Heat sinks absorb the generated heat from the electronic components and transfer the heat away from the components. The heat from the heat sinks are vented away from the server using convection, i.e., air flow. The air flow is often generated by a fan system that accelerates air through the components and the heat sink. The generated air flow thus carries the collected heat away from the components and the heat sink.

In typical servers, the system power for cooling such components is limited by the physical design. Thus, the operating velocity of such devices is constrained by the thermal design, as components must sometimes be run at lower velocities so they don't overheat. By the principles of energy conversion, the power limitation of a fan-cooled device is proportional to the air quantity flowing through the device. The greater the air quantity, the more air flow is available for cooling; and therefore, the performance of the system is increased.

Thus, there is a great need for providing a system and method that solves the above and other problems, including, for example, a chassis with apertures forming an air flow path that removes heat from a plurality of electronic components.

SUMMARY

According to one embodiment of the present disclosure, a chassis includes a receiver frame for receiving a plurality of electronic components. The receiver frame includes a front end, a rear end, a top wall, and a bottom wall. The receiver frame also includes one or more apertures positioned in the bottom wall or the top wall at a location adjacent to the front end. The receiver frame also includes a plurality of air flow channels coupling openings in the front end to the one or more apertures. The air flow from the openings of the front end is first directed towards the rear end across the plurality of electronic components before being directed back towards the front end and then exiting the one or more apertures.

In some implementations of this embodiment, the air flow channels are configured such that air flow from the rear end towards the one or more apertures passes across the plurality of electronic components. In some other implementation, the chassis also includes a fan having a fan inlet that is fluidly coupled to the one or more apertures. In other implementations, the fan is positioned within a vertical plane intersecting the receiver frame. In other implementations, the chassis includes a fan opening positioned vertically adjacent to the receiver frame. The fan is located within the fan opening. The chassis also includes a baffle defining a channel for directing flow from the one or more apertures into the inlet of the fan. The baffle is positioned within the fan opening. In yet other implementations, the baffle is positioned in the fan opening such that a first portion of the air flow through the fan originates from the one or more apertures and a second portion of the air flow through the fan originates from the fan opening.

According to another embodiment of the present disclosure, a receiver frame for receiving a plurality of electronic components is provided. The receiver frame includes a front end, a rear end, a top wall, and a bottom wall. The receiver frame also includes one or more apertures positioned in the bottom wall or the top wall at a location adjacent to the front end. The receiver frame further includes a plurality of air flow channels coupling openings in the front end to the one or more apertures, such that air flow from the openings of the front end is directed towards the rear end across the plurality of electronic components before being direct back towards the front end and then exiting the one or more apertures.

In some implementations of this embodiment, the plurality of air flow channels is configured such that flow from the rear end towards the one or more apertures passes across the plurality of electronic components. In some other implementations, an inlet of a fan is fluidly coupled to the one or more apertures. In other implementations, the fan is positioned within a vertical plane intersecting the receiver frame. In other implementations, a fan opening is positioned vertically adjacent to the receiver frame. The fan is located within the fan opening. A baffle defining a channel for directing air flow from the one or more apertures into the inlet of the fan is positioned within the fan opening. In some implementations, the baffle is positioned in the fan opening such that a first portion of the air flow through the fan originates from the one or more apertures and a second portion of the air flow through the fan originates from the fan opening.

According to yet another embodiment of the present disclosure, a method of directing air flow through a receiver frame for receiving a plurality of electronic components is also provided. The method includes receiving air flow from openings of a front end of the receiver frame, directing the air flow towards a rear end of the receiver frame and across a plurality of electronic components. The method further includes directing the air flow back towards the front end and then exiting one or more apertures in a bottom wall or a top wall of the receiver frame at a location adjacent to the front end.

In some implementations of this embodiment, directing the air flow back towards the front end and then exiting the one or more apertures includes directing the air flow across the plurality of electronic components. In some other implementations, the method also includes receiving air flow from an inlet of a fan fluidly coupled to the one or more apertures. In some other implementations, the method also includes positioning the fan within a vertical plane intersecting the receiver frame. In some other implementations, the method also includes positioning a fan opening vertically adjacent to the receiver frame, positioning the fan within the fan opening, directing air flow from the one or more apertures into the inlet of the fan using a baffle defining a channel, and positioning the baffle within the fan opening. In some other implementations, the baffle is positioned in the fan opening such that a first portion of the air flow through the fan originates from the one or more apertures and a second portion of the air flow through the fan originates from the fan opening.

Additional features and advantages of the disclosure will be set forth in the description that follows, and in part, will be obvious from the description; or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited disclosure and its advantages and features can be obtained, a more particular description of the principles described above will be rendered by reference to specific examples illustrated in the appended drawings. These drawings depict only example aspects of the disclosure, and are therefore not to be considered as limiting of its scope. These principles are described and explained with additional specificity and detail through the use of the following drawings.

DETAILED DESCRIPTION

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
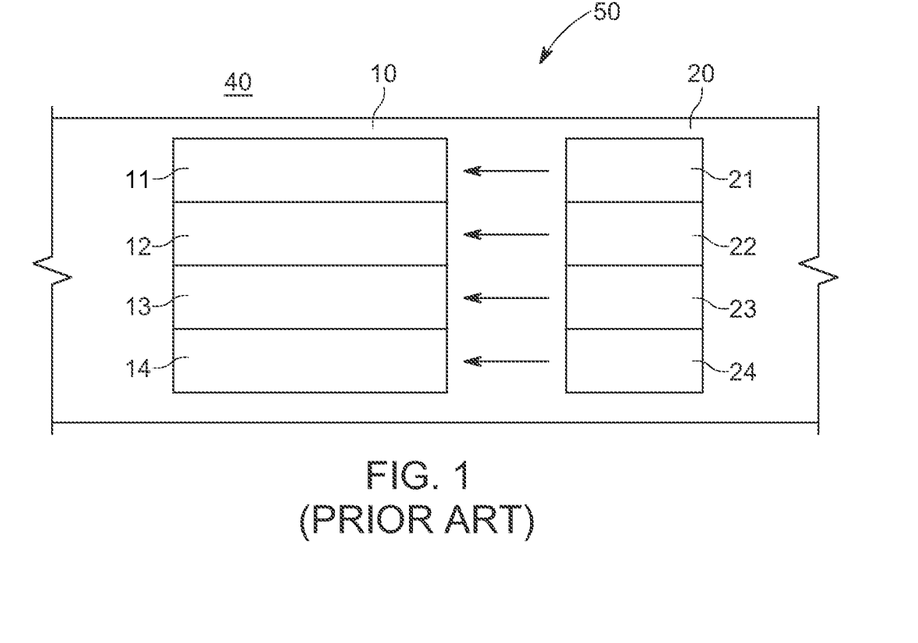
FIG. 1 is a side view of a traditional exemplary memory housing system, as known in the prior art.

FIG. 1 is a side view of a traditional exemplary memory housing system 50, as known in the prior art. The traditional exemplary memory housing system 50 includes a plurality of electronic components illustrated, for example, as hard drives 10. As illustrated herein, the plurality of hard drives 10 includes a first hard drive 11, a second hard drive 12, a third hard drive 13, and a fourth hard drive 14. The memory housing system 50 also includes a plurality of fan modules 20. The plurality of fan modules 20 includes a first fan module 21, a second fan module 22, a third fan module 23, and a fourth fan module 24. Each hard drive in the plurality of hard drives 10 is aligned with corresponding fan modules of the plurality of fan modules 20. Furthermore, each hard drive in the plurality of hard drives 10 is separated with nominal spacing. As a result, air flow received from each fan module of the plurality of fan modules 20 is unable to pass through the hard drives for cooling efficiency. This configuration has poor cooling performance. In addition, the illustrated configuration requires a considerable amount of space within a chassis device 40.

Figure 2:
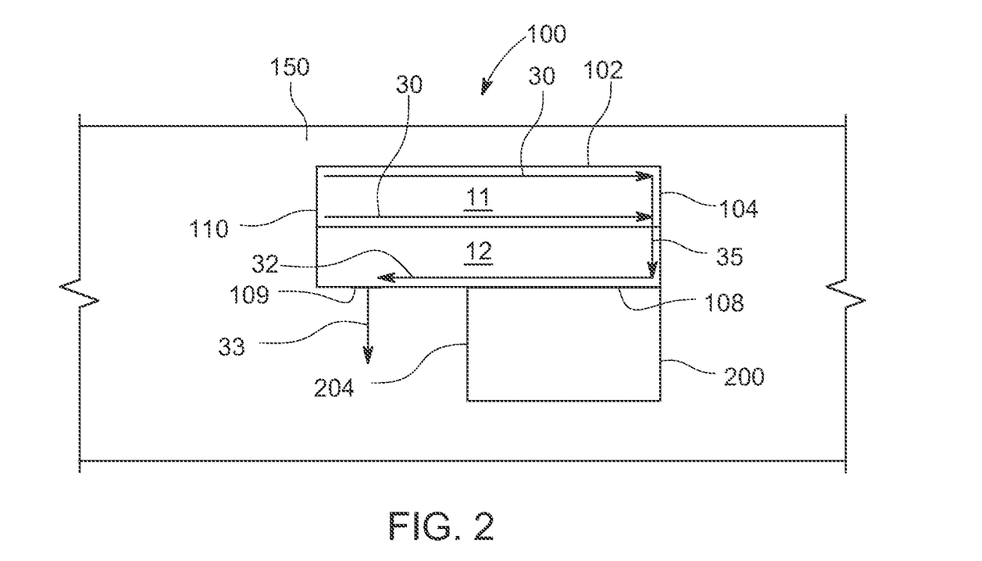
FIG. 2 is a side view of an exemplary electronic component housing system, in accordance with an implementation of the disclosure.

FIG. 2 is a side view of an exemplary electronic component housing system 100, in accordance with an implementation of the disclosure. The electronic component housing system or chassis 100 includes a receiver frame 150. The receiver frame 150 includes a front end 110, a rear end 104, a top wall 102, and a bottom wall 108. The receiver frame 150 also includes one or more apertures 109 in the bottom wall 108 or the top wall 102. In some implementations, the one or more apertures 109 can be located at or adjacent to the front end 110. The receiver frame 150 is configured to receive the first electric component 11 and the second electronic component 12.

The receiver frame 150 also includes a plurality of first air flow channels 30 coupling openings in the front end 110 to the one or more apertures 109, such that air flowing through the first air flow channels 30 from the openings of the front end 110 is directed towards the rear end 104 across the plurality of electronic components 11, 12. The air flow is then directed down along a second air flow channel 35, before being direct back towards the front end 110 along a third air flow channel 32, and then exiting the one or more apertures 109. In some implementations, the third air flow channel 32 is configured such that flow from the rear end 104 towards the one or more apertures 109 passes across the second electronic component 12.

According to some implementation that chassis 100 includes a fan 200 having a fan inlet 204 that is fluidly coupled to the one or more apertures 109. The fan 200 is positioned within a vertical plane intersecting the receiver frame 150. The receiver frame 150 also includes a fan opening 206 positioned vertically adjacent to the receiver frame 150, with the fan 200 being located within the fan opening 206, with the fan inlet 204 being generally illustrated overlapping with the fan opening 206.

Figure 3:
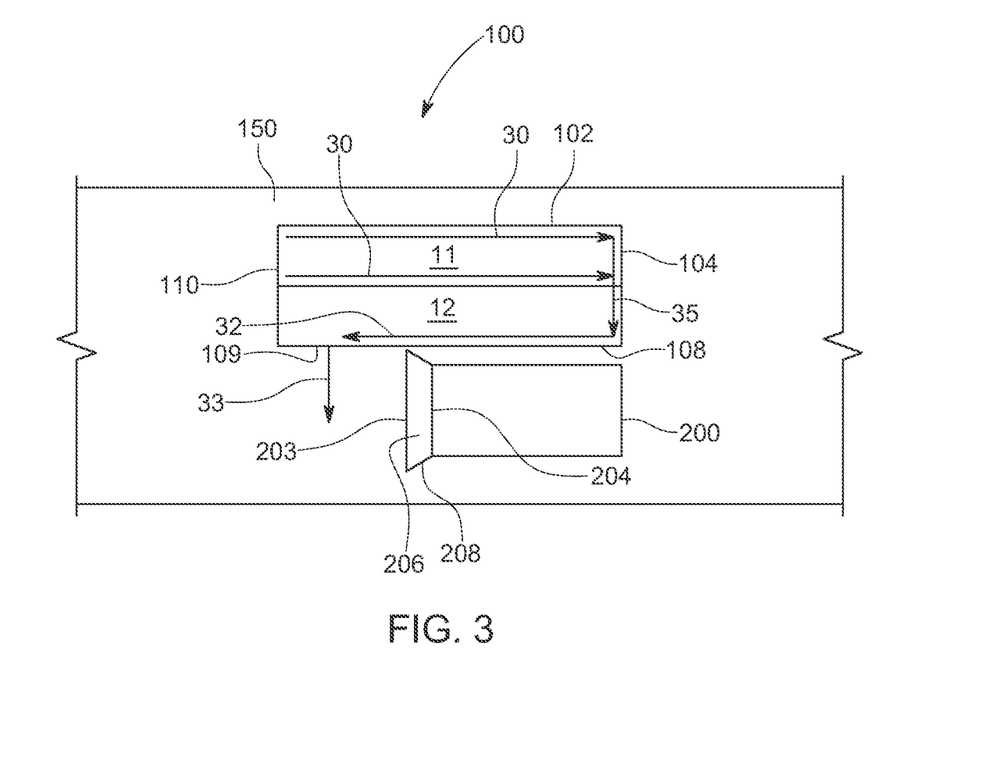
FIG. 3 is a side view of an exemplary electronic component housing system, in accordance with another implementation of the disclosure.

FIG. 3 is a side view of another illustration of the electronic component housing system 100, in accordance with another implementation of the disclosure. In this example, the chassis 100 also includes a baffle 208 that defines a channel 203 for directing flow from the one or more apertures 109 into the fan inlet 204 of the fan 200. The baffle 208 is positioned within the fan opening 206. In some implementations, the baffle 208 is positioned in the fan opening 206 such that a first portion of airflow through the fan 200 originates from the one or more apertures 109, and a second portion of the air flow through the fan 200 originates from the fan opening 206. In some alternate illustrations, a baffle can be positioned in a fan opening such that all of the airflow through the fan originates from the one or more apertures.

Figures 4A, 4B:
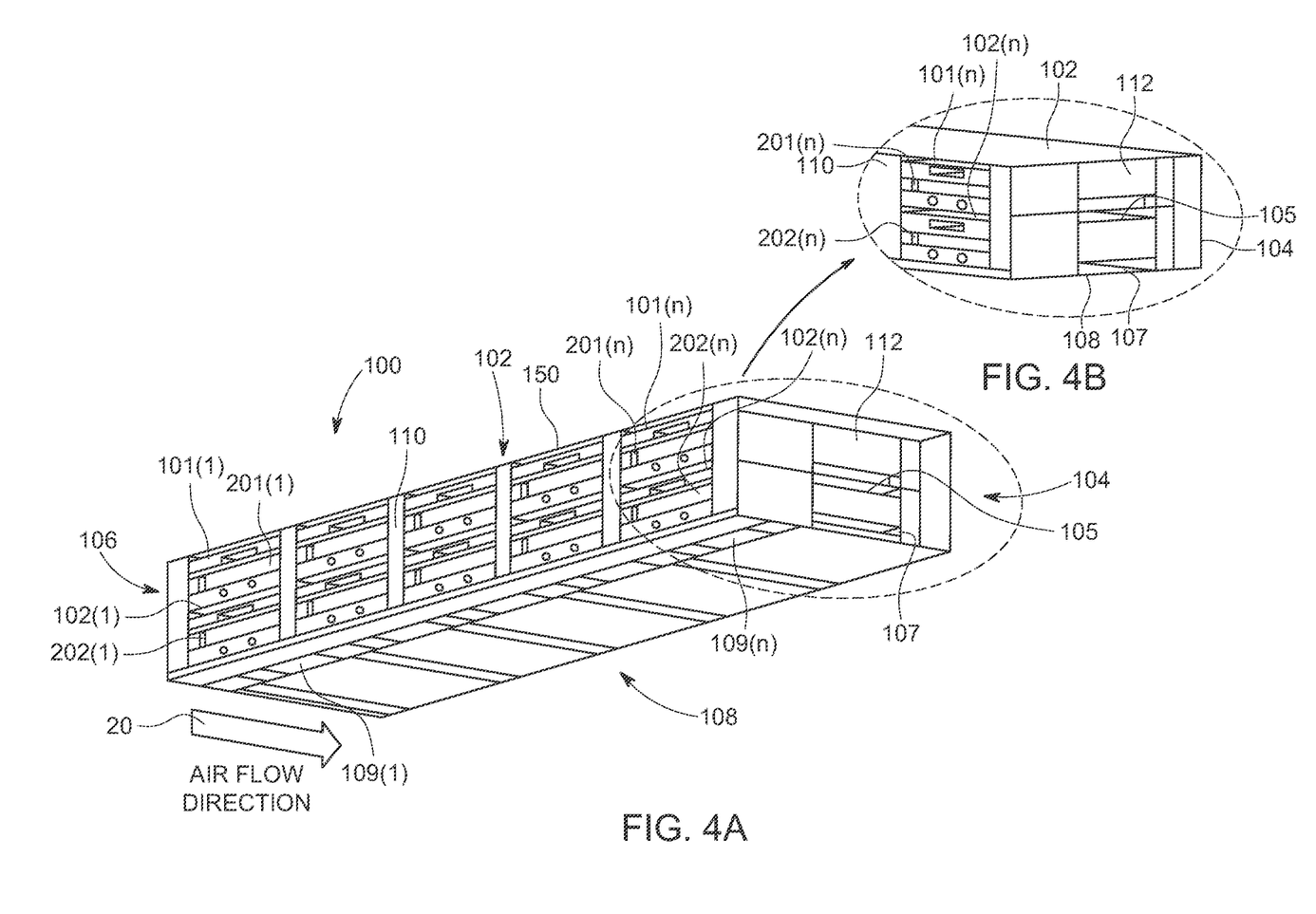
FIG. 4A is a front-perspective view of the exemplary electronic component housing system of FIG. 2.
FIG. 4B is an enlarged view showing a portion of the exemplary electronic component housing system of FIG. 4A.

FIGS. 4A and 4B show a front-perspective view of the exemplary electronic component housing system 100 of FIG. 2. As illustrated herein, the receiver frame 150 includes a first plurality of electronic devices 201(n) and a second plurality of electronic devices 202(n) positioned beneath the plurality of electronic devices 201(n). The front end 110 also includes a first plurality of openings 101(n) and a second plurality of openings 102(n). Each opening of the first plurality of openings 101(n) coincides with a respective electronic device of the first plurality of electronic devices 201(n). Similarly, each opening in the second plurality of openings 102(n) coincides with a respective electronic device of the second plurality of electronic devices 202(n). The first plurality of openings 101(n) and the second plurality of openings 102(n) are fluidly coupled to the first air flow channels 30 (illustrated in FIG. 3). As illustrated herein, the receiver frame 150 includes a plurality of apertures 109(n). Each aperture of the plurality of apertures 109(n) coincides with a respective electronic device of the first and second plurality of electronic devices. The receiver frame 150 also includes a proximal end 106 and a distal end 112. The distal end 112 includes an opening 105 that passes through the entire receiver frame 150 to the proximal end 106. The opening 105 separates the first plurality of electronic devices 201(n) and the second plurality of electronic devices 202(n), facilitating air flow between each one of the heat-generating electronic devices 201(n), 202(n).

Figure 5:
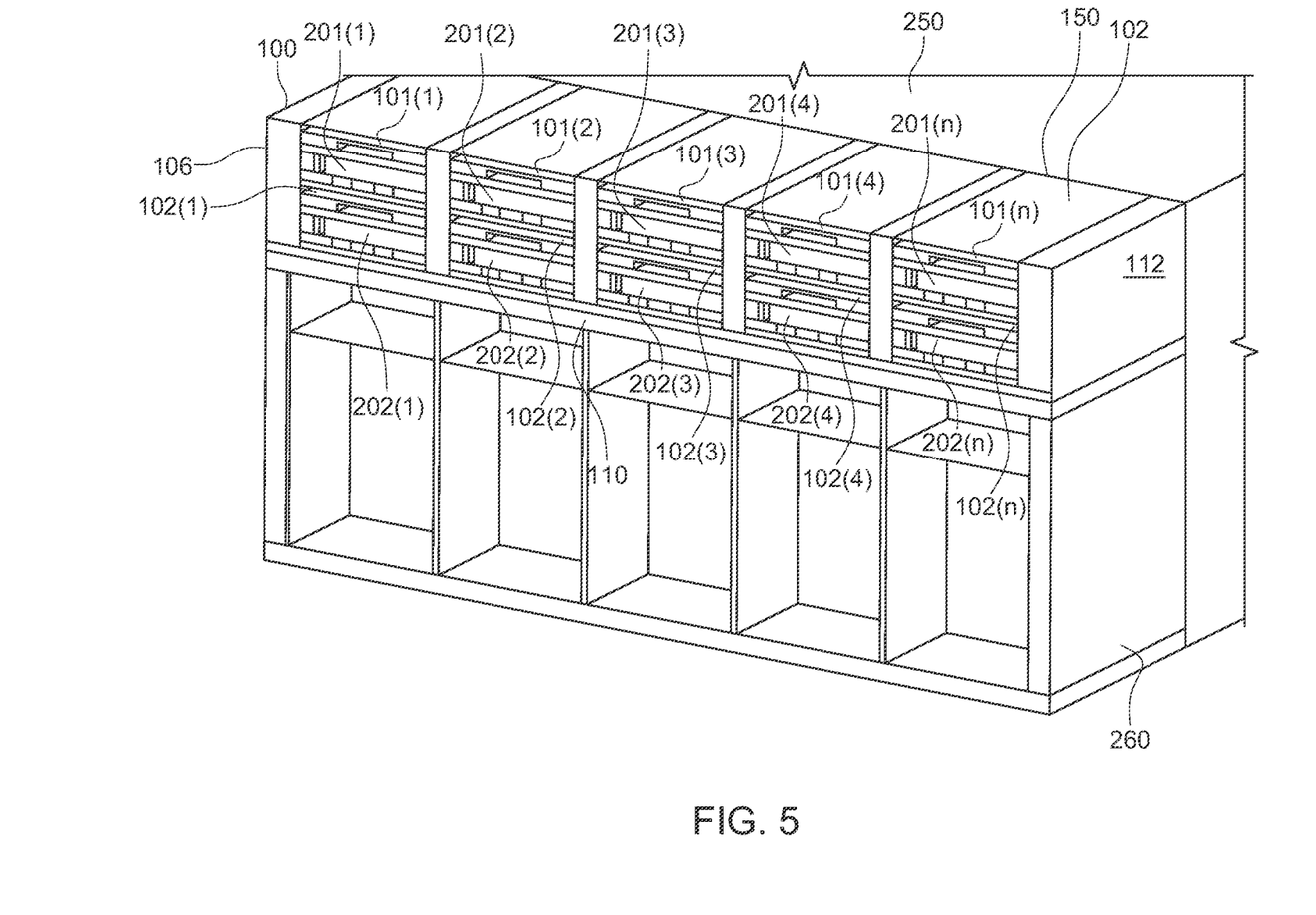
FIG. 5 is a front-perspective view of the electronic component housing system of FIG. 4 illustrated within a server device, in accordance with yet another implementation of the disclosure.

FIG. 5 is a front-perspective view of the electronic component housing system 100 positioned within a server device 250, in accordance with an implementation of the disclosure. As illustrated herein, the server device 250 is configured to receive the receiver frame 150. The receiver frame 150 is positioned on top of a server frame 260. In some implementations, the server device 250 is configured to house multiple receiver frames 150 instead of the server frame 260. In this configuration, advantageously, the number of electronic devices 201(n), 202(n) (e.g., hard drives) implemented is reduced, and the fan module 200 is positioned underneath the electronic devices 201(n), 202(n). In this configuration, according to yet another advantage of the present disclosure, the overall depth used for the fan module 200 and electronic devices 201(n), 202(n) is reduced. Receiving air flow from the front of the electronic devices 201(n), 202(n) towards the rear, and then back from the rear towards the front, allows for adequate cooling.

Figure 6:
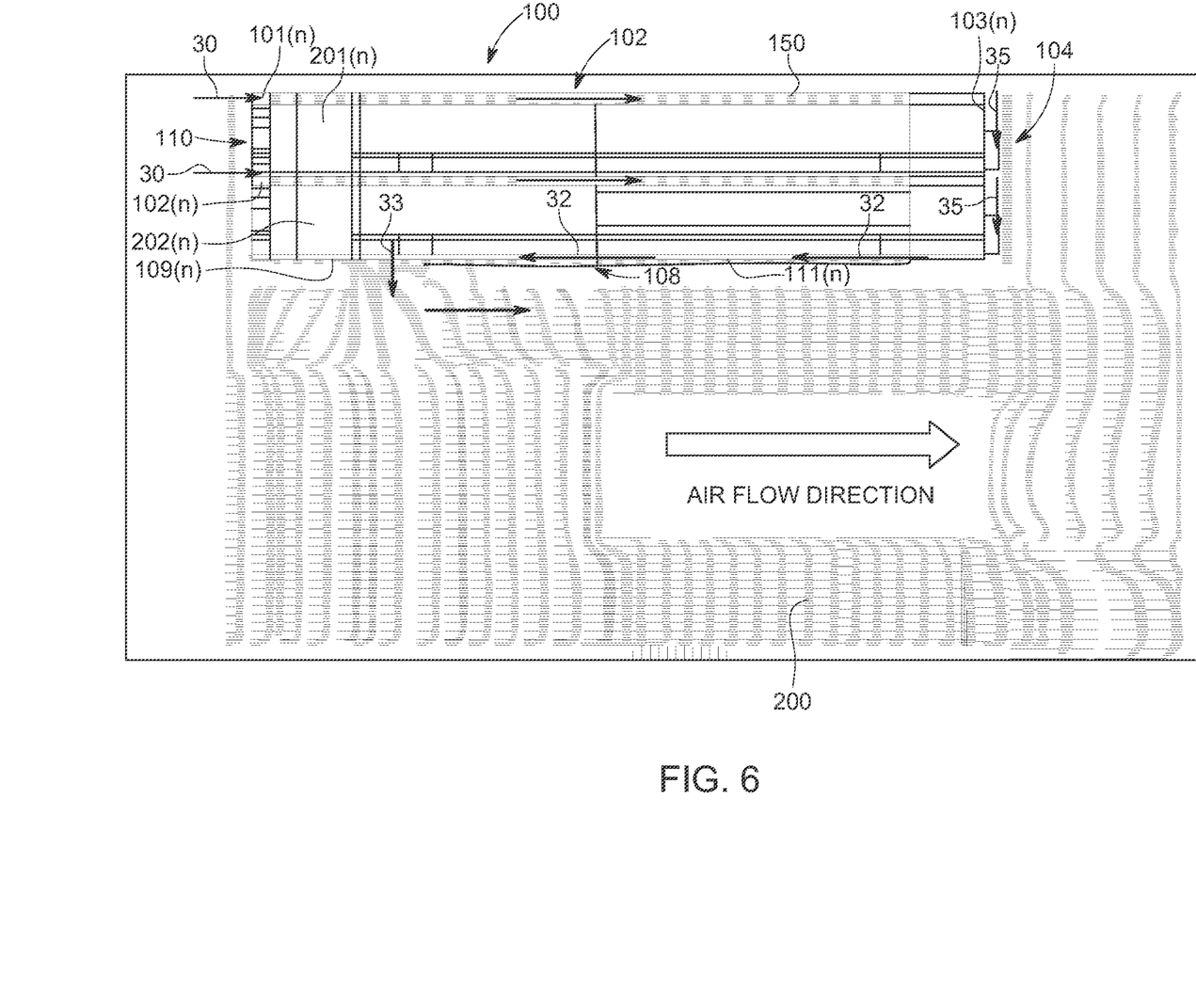
FIG. 6 illustrates a velocity flow model of the cooling system of the electronic component housing system of FIG. 2, in accordance with yet another embodiment of the disclosure.

FIG. 6 illustrates a velocity flow model of the cooling system of the electronic component housing system 100 of FIG. 2, in accordance with an embodiment of the disclosure. As illustrated herein, the receiver frame 150 includes the first air flow channels 30 coupling openings in the front end 110 to the one or more apertures 109, such that air flowing through the first air flow channels 30 from the openings 101(n), 102(n) of the front end is directed towards the rear end 104, across the first plurality of electronic devices 201(n) and the second plurality of electronic devices 202(n). The air flow is then directed down along the second air flow channel 35 before being direct back towards the front end 110 along the third air flow channel 32, and then exiting the one or more apertures 109. In some implementations, the third air flow channel 32 is configured such that flow from the rear end 104 towards the one or more apertures 109 passes across the second plurality of electronic devices 202(n).

Figure 7:
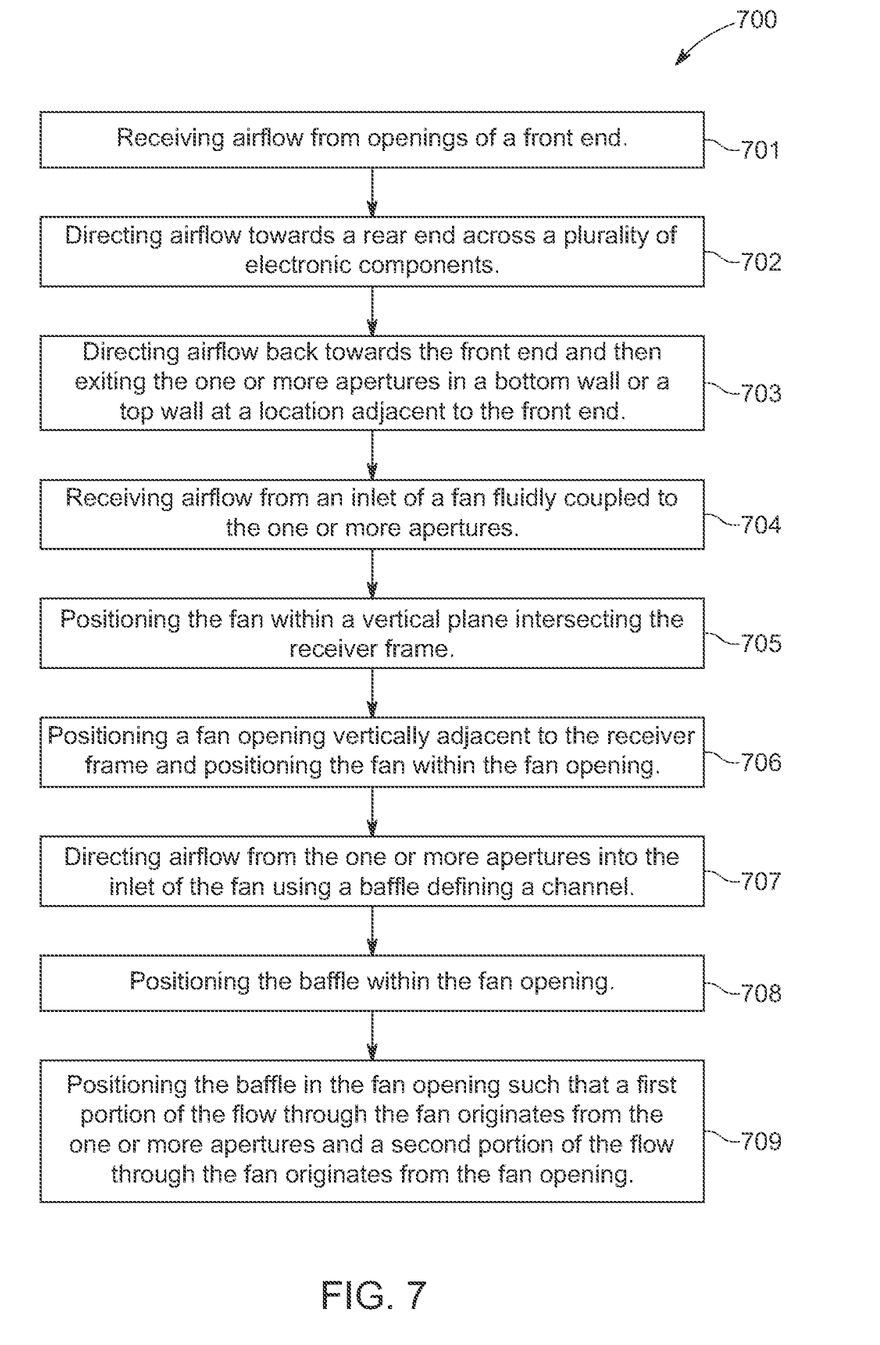
FIG. 7 is a flow chart illustrating a process for directing air flow through a receiver frame for receiving a plurality of electronic components, according to certain aspects of the present disclosure.

FIG. 7 is a flow chart illustrating a process for directing air flow through a receiver frame for receiving a plurality of electronic components, according to certain aspects of the present disclosure as described above. The process 700 starts at step 701 where air flow is received from openings of a front end. The process 700 advances to step 702, where the air flow is directed towards a rear end across a plurality of electronic components. The process 700 also advances to step 703, where the air flow is directed back towards the front end, and then exits the one or more apertures in a bottom wall or a top wall at a location adjacent to the front end.

In some implementations, directing the air flow back towards the front end, and then exiting the one or more apertures, specifically includes directing the air flow across the plurality of electronic components. The process 700 also advances to step 704, where air flow is received from an inlet of a fan fluidly coupled to the one or more apertures. The process 700 further advances to step 705, where the fan is positioned within a vertical plane intersecting the receiver frame.

In some implementations, the process 700 advances to step 706, where a fan opening is positioned vertically adjacent to the receiver frame, and the fan is positioned within the fan opening. The process 700 advances to step 707, where air flow is directed from the one or more apertures into the inlet of the fan using a baffle defining a channel. At step 708, the baffle is positioned within the fan opening. Finally, at step 709, the baffle is positioned in the fan opening such that a first portion of the flow through the fan originates from the one or more apertures and a second portion of the flow through the fan originates from the fan opening.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A chassis comprising:
   a receiver frame having a front end for receiving a plurality of electronic components, the receiver frame further including a rear end, a top wall, and a bottom wall;
   an aperture positioned in the bottom wall at a location adjacent to the front end;
   a first air flow channel at the top wall, the first air flow channel coupling a first opening in the front end to the aperture via a second air flow channel positioned at the rear end; and
   a third air flow channel positioned between the first air flow channel and the bottom wall, the third air flow channel coupling a second opening in the front end to the aperture via the second air flow channel;
   wherein first air flow from the first opening and second air flow from the second opening are first directed towards the rear end across the plurality of electronic components before being directed down towards the bottom wall via the second air flow channel, being directed back towards the front end, and then exiting the aperture.

2. The chassis of claim 1, further comprising a fourth air flow channel coupling the second air flow channel and the aperture such that flow from the rear end towards the aperture passes across the plurality of electronic components.

3. The chassis of claim 1, further comprising a fan having a fan inlet that is fluidly coupled to the aperture.

4. The chassis of claim 3, wherein the fan is positioned within a vertical plane intersecting the receiver frame.

5. The chassis of claim 4, further comprising:
   a fan opening positioned vertically adjacent to the receiver frame, the fan being located within the fan opening; and
   a baffle defining a channel for directing flow from the aperture into the inlet of the fan, the baffle being positioned within the fan opening.

6. The chassis of claim 5, wherein the baffle is positioned in the fan opening such that a first portion of the air flow through the fan originates from the aperture and a second portion of the air flow through the fan originates from the fan opening.

7. The chassis of claim 4, wherein the fan is positioned such that the third air flow channel is located between the first air flow channel and the fan.

8. A receiver frame for receiving a plurality of electronic components, the receiver frame comprising:
   a front end for receiving the plurality of electronic components;
   a rear end;
   a top wall;
   a bottom wall;
   an aperture positioned in the bottom wall at a location adjacent to the front end;
   a top air flow channel at the top wall, the top air flow channel coupling a first opening in the front end to the aperture via a rear air flow channel positioned at the rear end; and
   a middle air flow channel positioned between the top air flow channel and the bottom wall, the middle air flow channel coupling a second opening in the front end to the aperture via the rear air flow channel;
   wherein first air flow from the first opening and second air flor from the second opening are directed towards the rear end across the plurality of electronic components before being directed down towards the bottom wall via the rear air flow channel, being directed back towards the front end, and then exiting the aperture.

9. The receiver frame of claim 8, further comprising a bottom air flow channel coupling the rear air flow channel and the aperture such that flow from the rear end towards the aperture passes across the plurality of electronic components.

10. The receiver frame of claim 8, wherein an inlet of a fan is fluidly coupled to the aperture.

11. The receiver frame of claim 8, wherein the fan is positioned within a vertical plane intersecting the receiver frame.

12. The receiver frame of claim 11,
    wherein a fan opening is positioned vertically adjacent to the receiver frame, the fan being located within the fan opening; and
    wherein a baffle defining a channel for directing the air flow from the aperture into the inlet of the fan is positioned within the fan opening.

13. The receiver frame of claim 12, wherein the baffle is positioned in the fan opening such that a first portion of the air flow through the fan originates from the aperture and a second portion of the air flow through the fan originates from the fan opening.

14. The receiver frame of claim 11, wherein the fan is positioned such that the middle air flow channel is located between the top air flow channel and the fan.

15. A method of directing air flow through a receiver frame for receiving a plurality of electronic components, the method comprising:
    receiving air flow from a first opening and a second opening of a front end of the receiver frame;
    directing the air flow towards a rear end of the receiver frame and across a plurality of electronic components, wherein directing the air flow towards the rear end includes i) directing first air flow from the first opening to a rear air flow channel via a top air flow channel positioned at the top wall, and ii) directing second air flow from the second opening to the rear air flow channel via a middle air flow channel positioned between the top air flow channel and the bottom wall; and
    directing the air flow back towards the front end and then exiting an aperture in a bottom wall of the receiver frame at a location adjacent to the front end.

16. The method of claim 15, wherein directing the air flow back towards the front end and then exiting the aperture includes directing the air flow across the plurality of electronic components and through a bottom air flow channel coupling the rear air flow channel and the aperture.

17. The method of claim 15, further comprising receiving air flow from an inlet of a fan fluidly coupled to the aperture.

18. The method of claim 17, further comprising positioning the fan within a vertical plane intersecting the receiver frame, wherein the fan is positioned such that the middle air flow channel is located between the top air flow channel and the fan.

19. The method of claim 17, further comprising:
positioning a fan opening vertically adjacent the receiver frame and positioning the fan within the fan opening;
directing air flow from the aperture into the inlet of the fan using a baffle defining a channel; and
positioning the baffle within the fan opening.

20. The method of claim 19, wherein the baffle is positioned in the fan opening such that a first portion of the air flow through the fan originates from the aperture and a second portion of the air flow through the fan originates from the fan opening.

* * * * *